(12) United States Patent
Chen et al.

(10) Patent No.: US 9,082,902 B2
(45) Date of Patent: Jul. 14, 2015

(54) SOLAR CELL

(71) Applicant: AU Optronics Corp., Hsin-Chu (TW)

(72) Inventors: Peng Chen, Hsin-Chu (TW); Shuo-Wei Liang, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/578,479

(22) Filed: Dec. 21, 2014

(65) Prior Publication Data

US 2015/0101660 A1 Apr. 16, 2015

Related U.S. Application Data

(62) Division of application No. 13/862,486, filed on Apr. 15, 2013, now Pat. No. 8,987,588.

(30) Foreign Application Priority Data

Jul. 9, 2012 (CN) .......................... 2012 1 0236407

(51) Int. Cl.
H01L 31/052 (2014.01)
H01L 31/0224 (2006.01)
H01L 31/065 (2012.01)
H01L 31/18 (2006.01)

(52) U.S. Cl.
CPC ...... H01L 31/022458 (2013.01); H01L 31/065 (2013.01); H01L 31/18 (2013.01); Y02E 10/50 (2013.01)

(58) Field of Classification Search
CPC .................................................... H01L 31/052
USPC ................. 136/256, 255, 252; 438/72, 96, 97
See application file for complete search history.

(56) References Cited

U.S. PATENT DOCUMENTS

| 4,315,097 | A | 2/1982 | Solomon |
|---|---|---|---|
| 4,838,952 | A | 6/1989 | Dill |
| 4,927,770 | A | 5/1990 | Swanson |
| 7,029,943 | B2 | 4/2006 | Kruhler |
| 7,951,637 | B2 | 5/2011 | Weidman |
| 8,507,298 | B2 | 8/2013 | Ramappa |
| 8,829,339 | B2 | 9/2014 | Fogel |
| 2004/0043528 | A1 | 3/2004 | Kruhler |
| 2010/0084009 | A1 | 4/2010 | Carlson |
| 2010/0129955 | A1 | 5/2010 | Luan |
| 2010/0139764 | A1 | 6/2010 | Smith |
| 2010/0224240 | A1 | 9/2010 | Bateman |
| 2010/0229928 | A1 | 9/2010 | Zuniga |
| 2010/0243041 | A1 | 9/2010 | Carlson |
| 2012/0167973 | A1 | 7/2012 | Hu |

FOREIGN PATENT DOCUMENTS

| CN | 101728452 A | 6/2010 |
|---|---|---|
| CN | 102142478 A | 8/2011 |
| CN | 102376789 A | 3/2012 |
| TW | 201228017 | 7/2012 |

*Primary Examiner* — Golam Mowla
(74) *Attorney, Agent, or Firm* — Winston Hsu; Scott Margo

(57) ABSTRACT

A solar cell is provided. The substrate of the solar cell has heavily-doped regions and lightly-doped regions. The anode and the cathode are disposed on the back surface of the substrate, and thus the amount of incident light on the front surface of the substrate is increased. The anode and the cathode are in contact with the heavily doped regions to form selective emitter structure, and thus the contact resistance is reduced. The lightly-doped regions, which are not in contact with the anode and the cathode, have lower saturation current, and thus recombination of hole-electron pairs is reduced, and absorption of infrared light is increased.

11 Claims, 12 Drawing Sheets

SOLAR CELL

CROSS REFERENCE TO RELATED APPLICATIONS

This application is a divisional of application Ser. No. 13/862,486 filed Apr. 15, 2013, which is incorporated by reference herein in its entirety.

BACKGROUND OF THE INVENTION

1. Field of the Invention

The disclosure relates to a solar cell, and more particularly, an interdigitated back electrode solar cell with a selective emitter structure.

2. Description of the Prior Art

A solar cell is a photo-electric conversion device which converts solar energy directly into electrical energy. As supply of our natural resources such as petroleum declines rapidly, solar energy is the most potential alternative energy. However, current solar technology is still limited by several obstacles, such as high production cost, complicated process, and low photo-electric conversion efficiency. Therefore, there are still many obstacles waiting to be overcome in the development of solar cell technology.

SUMMARY OF THE INVENTION

It is one of the objectives of the disclosure to provide a method for fabricating a solar cell, thereby boosting the conversion efficiency.

A solar cell in an embodiment of the disclosure includes a substrate, a first lightly-doped region, a first heavily-doped region, a second heavily-doped region, a first patterned doped stacked structure, a second doped layer, a first electrode and a second electrode. The substrate has a first surface and a second surface. The second surface is disposed opposite to the first surface, and the first surface is a light incident surface. The first lightly-doped region is disposed adjacent to the second surface in the substrate. The first heavily-doped region is disposed adjacent to the second surface in the substrate. Both of the first lightly-doped region and the first heavily-doped region have a first doped type. The second heavily-doped region is disposed adjacent to the second surface in the substrate, and the second heavily-doped region has a second doped type opposite to the first doped type. The first patterned doped stacked structure is disposed on the second surface of the substrate and corresponds to the first lightly-doped region. Moreover, the first patterned doped stacked structure exposes the first heavily-doped region and the second heavily-doped region. The first patterned doped stacked structure includes a first dielectric layer, a first doped layer and a second dielectric layer. The first dielectric layer, the first doped layer and the second dielectric layer are mutually stacked. The second doped layer is disposed on the first patterned doped stacked structure and the second surface in the substrate. The second doped layer exposes a portion of the first heavily-doped region and a portion of the second heavily-doped region. The first electrode electrically connects the first heavily-doped region exposed by the first patterned doped stacked structure and the second doped layer, and the second electrode electrically connects to the second heavily-doped region exposed by the first patterned doped stacked structure and the second doped layer.

The solar cell in the disclosure is an interdigitated back electrode solar cell with a selective emitter structure. Because the electrode contacts the heavily-doped region of the substrate, the contact resistance in the heavily-doped region of the substrate is lower and the saturation current in the lightly-doped region not contacting the electrode is lower. On the other hand, the lightly doped region improves the internal reflection of the infrared lights, which improves the light absorption of the solar cell. Therefore, the solar cell of the disclosure has less surface recombination and more electron-holes pairs generate, and at the same time, infrared absorption and photo-electric conversion efficiency increase. Comparing to the photo-electric conversion efficiency of a conventional interdigitated back electrode solar cell, the photo-electric conversion efficiency of the solar cell in the embodiments of the disclosure may further increase about 0.5% to about 0.6% substantially.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the disclosure, the embodiments will be made in detail. The embodiments of the disclosure are illustrated in the accompanying drawings with numbered elements. In addition, the terms such as "first" and "second" described in the disclosure are used to distinguish different components or processes, which do not limit the sequence of the components or processes.

Figure 1:
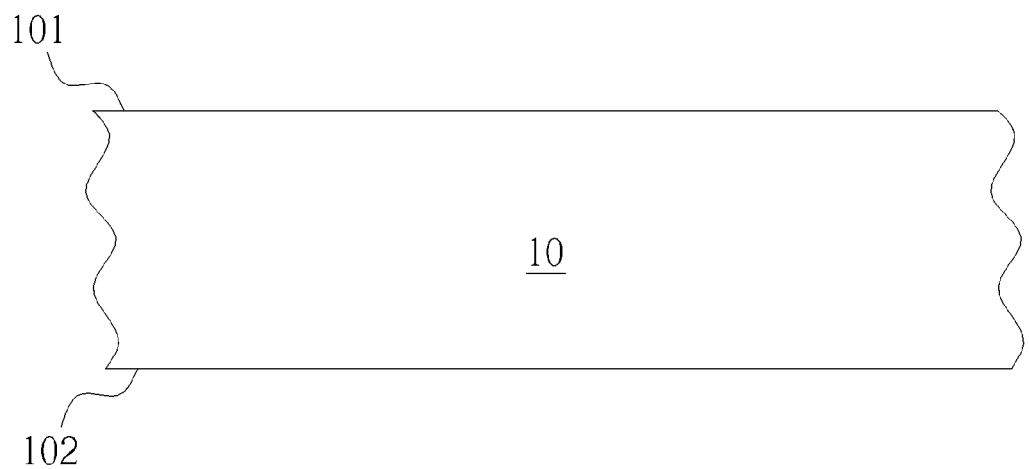
FIGS. 1-7 are schematic diagrams illustrating the method for fabricating a solar cell according to a first embodiment of this disclosure.

Referring to FIGS. 1-7 are schematic diagrams illustrating the method for fabricating a solar cell according to a first embodiment of this disclosure. As shown in FIG. 1, a substrate 10 is provided first. The substrate 10 may be a silicon substrate, which is, for example, a single crystalline silicon substrate or a polycrystalline silicon substrate, but not limited thereto. The substrate 10 may be any other kind of semiconductor substrates (or namely wafers). The thickness of the substrate 10 may be, for example, about 50 micrometers (μm) to about 300 micrometers (μm), but not limited thereto. The substrate 10 has a first surface (or namely front surface) 101 and a second surface (or namely back surface, rear surface) 102; the second surface 102 is opposite to the first surface 101, and the first surface 101 is as a light incident surface. A saw damage removal (SDR) process is then performed on the substrate 10: cleaning the substrate 10 with, for instance, acidic or Alkaline solution, to remove slight damage from the substrate 10.

Figure 2:
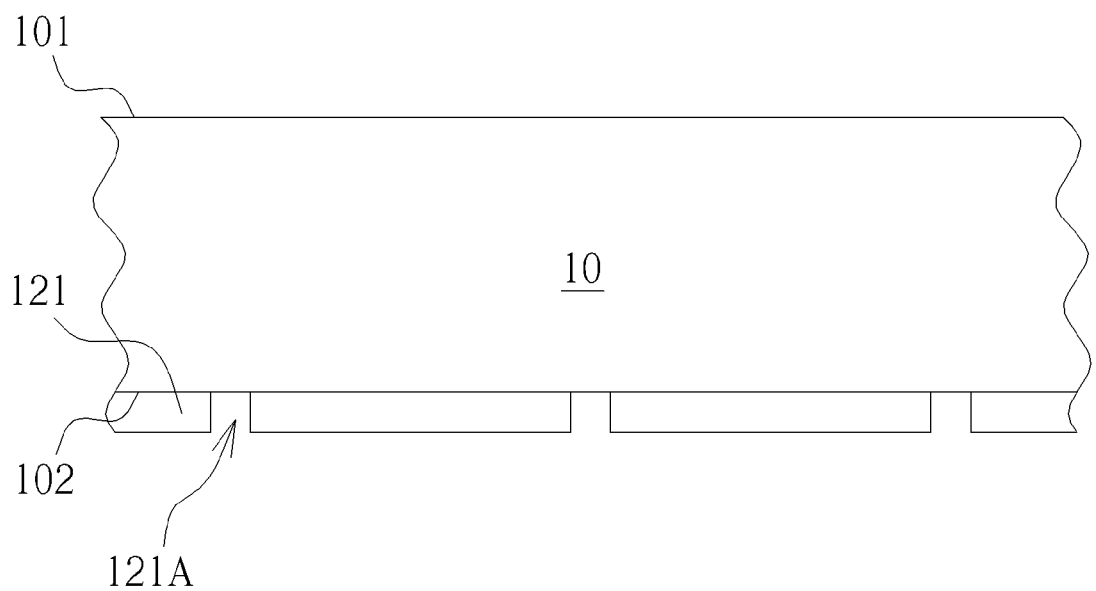
Figure 3:
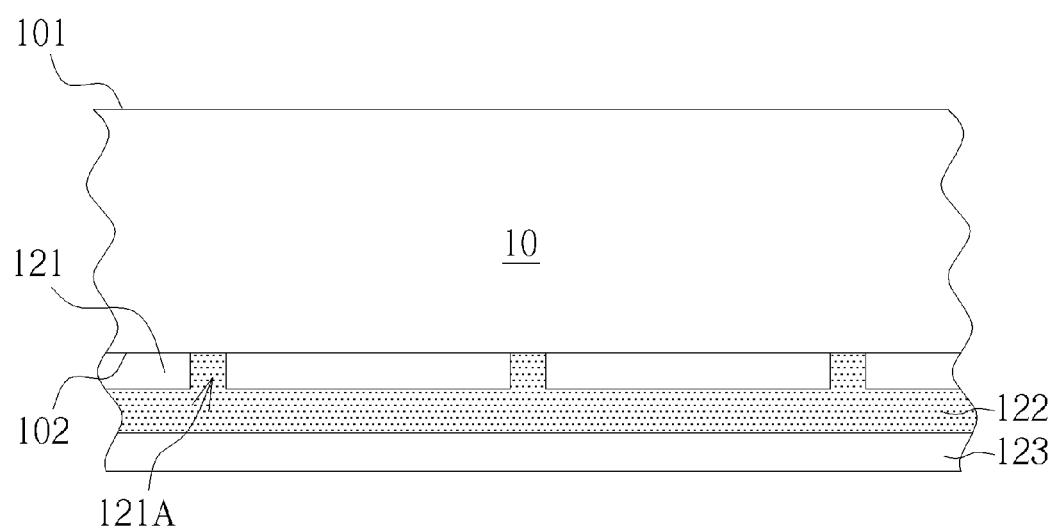
Figure 4:
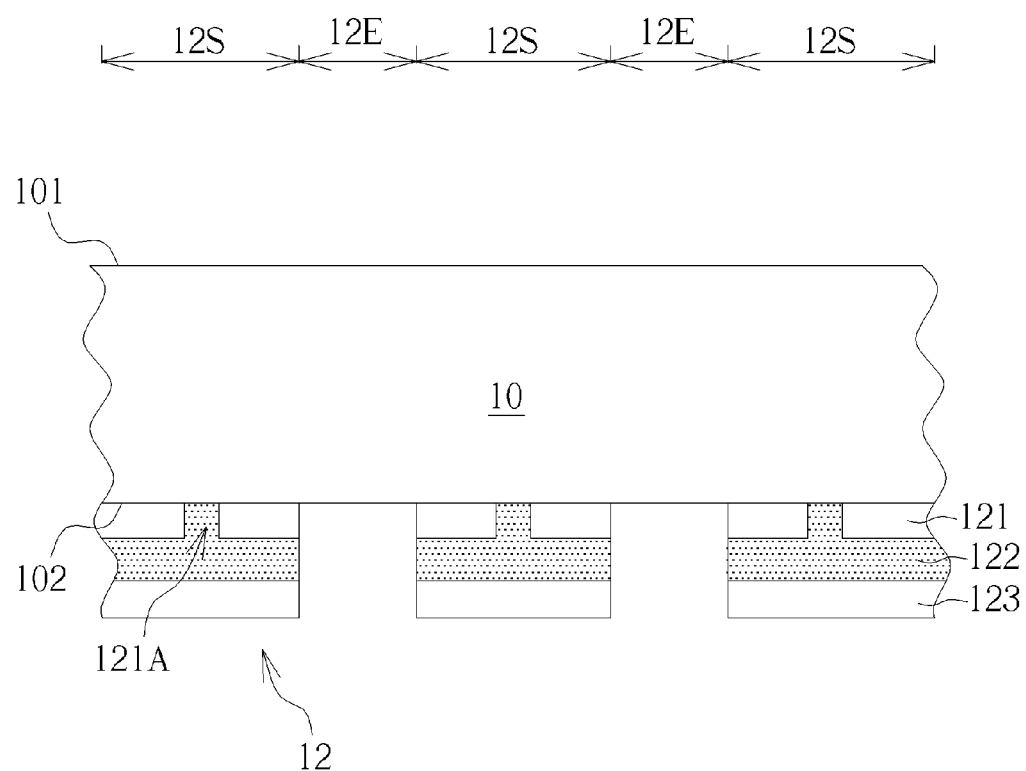
Figure 7:
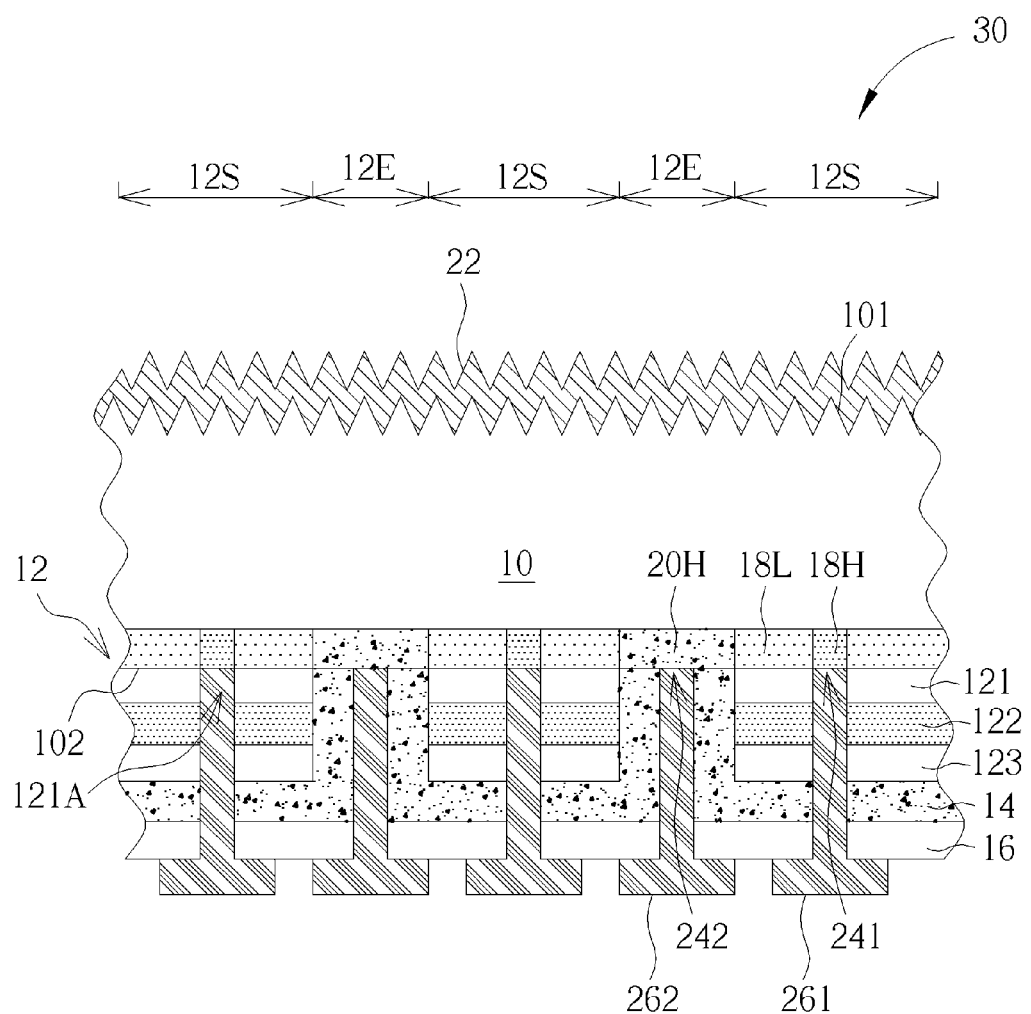

Then, as shown in FIG. 7, a first patterned doped stacked structure 12 is formed on the second surface 102 of the substrate 10 and a portion of the second surface 102 of the substrate 10 is exposed. In this embodiment, the method of forming the first patterned doped stacked structure 12 is as shown in FIGS. 2-4, but not limited thereto. As shown in FIG. 2, a first dielectric layer 121 is formed on the second surface 102 of the substrate 10. The first dielectric layer 121 is patterned to form openings 121A on itself. A portion of the second surface 102 of the substrate 10 is exposed through the openings 121A. The first dielectric layer 121 may be a single-layered or multiple-layered structure, but not limited thereto. The material of the first dielectric layer 121, preferred, inorganic dielectric materials may be silicon oxide, silicon oxynitride, or silicon nitride, but it may be other appropriate organic or inorganic dielectric materials, for example, alumina. The thickness of the first dielectric layer 121 is substantially range from 1 nanometer (nm) to 20 nanometer (nm), but not limited thereto. The first dielectric layer 121 may be formed by a chemical vapor deposition (CVD) process, for example, an atmospheric-pressure chemical vapor deposition (APCVD) process, and patterned by, for example, an etching process, but not limited thereto. The first dielectric layer 121 may also be formed by, for example, a physical vapor deposition process, chemical oxidation process, a spin coating process, an ink jet printing process, or a screen printing process. As shown in FIG. 3, then, a first doped layer 122 is formed on the first dielectric layer 121 and the second surface 102 of the substrate 10 exposed by the first dielectric layer 121. The first doped layer 122 contacts the second surface 102 of the substrate 10 through the openings 121A of the first dielectric layer 121. In other words, the first doped layer 122 not only contacts the second surface 102 within the openings 121A but also covers the first dielectric layer 121. The first doped layer 122 includes a plurality of first dopants (or namely implants or diffusers) of a first doped type. For example, in this embodiment, the first doped type may be p-type, the first doped layer 122 may be borosilicate glass (BSG), and the dopant may be boron, but not limited thereto. Then, a second dielectric layer 123 is formed on the first doped layer 122; that is to say, the second dielectric layer 123 covers the first doped layer 122. The thickness of the second dielectric layer 123 is substantially greater than 100 nm, but not limited thereto. The second dielectric layer 123 may be a single-layered or multiple-layered structure, but not limited thereto. The material of the second dielectric layer 123, preferred, inorganic dielectric materials may be silicon oxide, silicon oxynitride, or silicon nitride, but it may be other appropriate organic or inorganic dielectric materials, for example, alumina. The second dielectric layer 123 may be formed by a chemical vapor deposition (CVD) process, for example, an atmospheric-pressure chemical vapor deposition (APCVD) process, but not limited to this and the second dielectric layer 123 may also be formed by, for example, a physical vapor deposition process, chemical oxidation process, a spin coating process, an inkjet printing process, or a screen printing process. As shown in FIG. 4, after the first dielectric layer 121, the first doped layer 122 and the second dielectric layer 123 are patterned, the first dielectric layer 121, the first doped layer 122 and the second dielectric layer 123 are partially removed so as to form the first patterned doped stacked structure 12. The step to pattern the first dielectric layer 121, the first doped layer 122 and the second dielectric layer 123 may be carried out with an etching process, but not limited thereto. In other embodiments, the step to pattern the first dielectric layer 121, the first doped layer 122 and the second dielectric layer 123 may be carried out with an ink jet printing process and a screen printing process, but without an exposure step and a development step. The first patterned doped stacked structure 12 exposes a portion of the second surface 102 of the substrate 10 and covers a portion of the second surface 102 of the substrate 10. Therefore, at least one first shielded region 12S is formed on the second surface 102 covered by the first patterned doped stacked structure 12, and at least one first exposed region 12E is formed on the second surface 102 exposed by the first patterned doped stacked structure 12. The first exposed region 12E has a first dimension. It is worth noting that the openings 121A are substantially within the first shielded region 12S.

Figure 5:
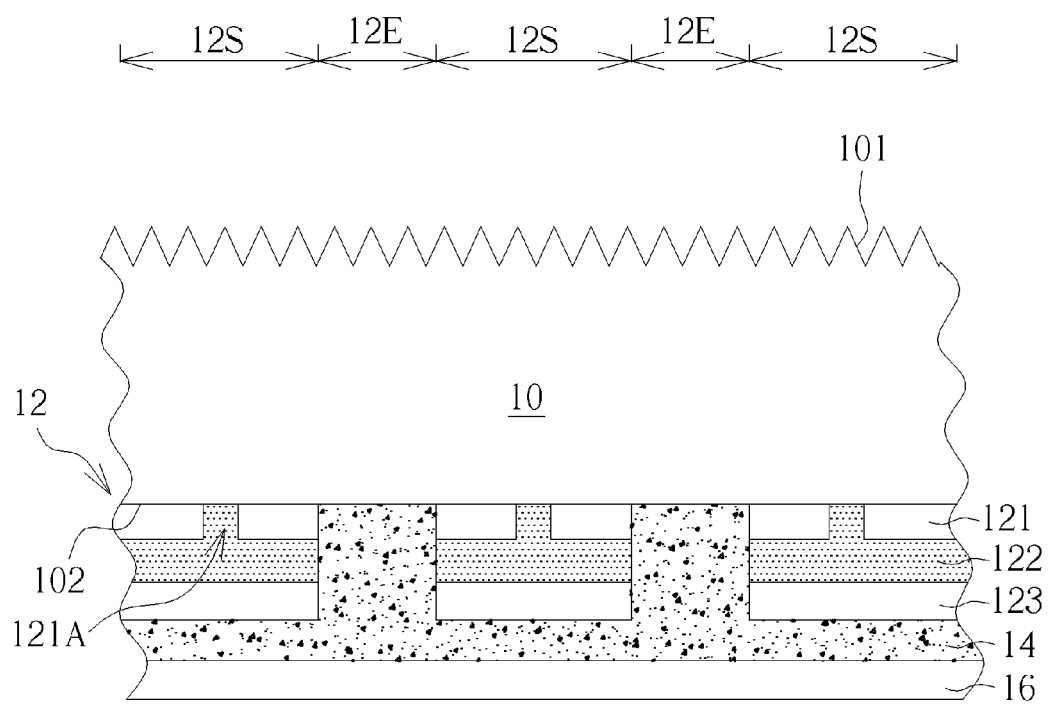

As shown in FIG. 5, a second doped layer 14 is formed and covers on the first patterned doped stacked structure 12 and the second surface 102 of the substrate 10. The second doped layer 14 contacts the second surface 102 which is exposed within the first exposed region 12E. The second doped layer 14 includes a plurality of second dopants of a second doped type, and the second doped type is opposite to the first doped type. For example, in this embodiment, the second doped type may be n-type, the second doped layer 14 may be phosphorosilicate glass (PSG) and the dopant may be phosphorous, but not limited thereto. Moreover, a third dielectric layer 16 may be formed on the second doped layer 14 selectively. The third dielectric layer 16 may be a single-layered or multiple-layered structure, but not limited thereto. The material of the third dielectric layer 16, preferred, inorganic dielectric materials may be silicon oxide, silicon oxynitride, or silicon nitride, but it may be other appropriate organic or inorganic dielectric materials, for example, alumina. The thickness of the third dielectric layer 16 is substantially greater than 100 nm, but not limited thereto. The third dielectric layer 16 may be formed by a chemical vapor deposition (CVD) process, for example, an atmospheric-pressure chemical vapor deposition (APCVD) process, but not limited to this and the third dielectric layer 16 may also be formed by, for example, a physical vapor deposition process, chemical oxidation process, a spin coating process, an ink jet printing process, or a screen printing process. The third dielectric layer 16 is used to promote the insulation of the solar cell, and avoid poor performance resulting from leakage currents from the anode and the cathode. Therefore, the material, the manufacture process and the thickness of the third dielectric layer 16 depend on the insulating properties. A texturing process is carried out to make the first surface 101 of the substrate 10 a textured surface, therefore increasing the incident light absorption.

Figure 6:
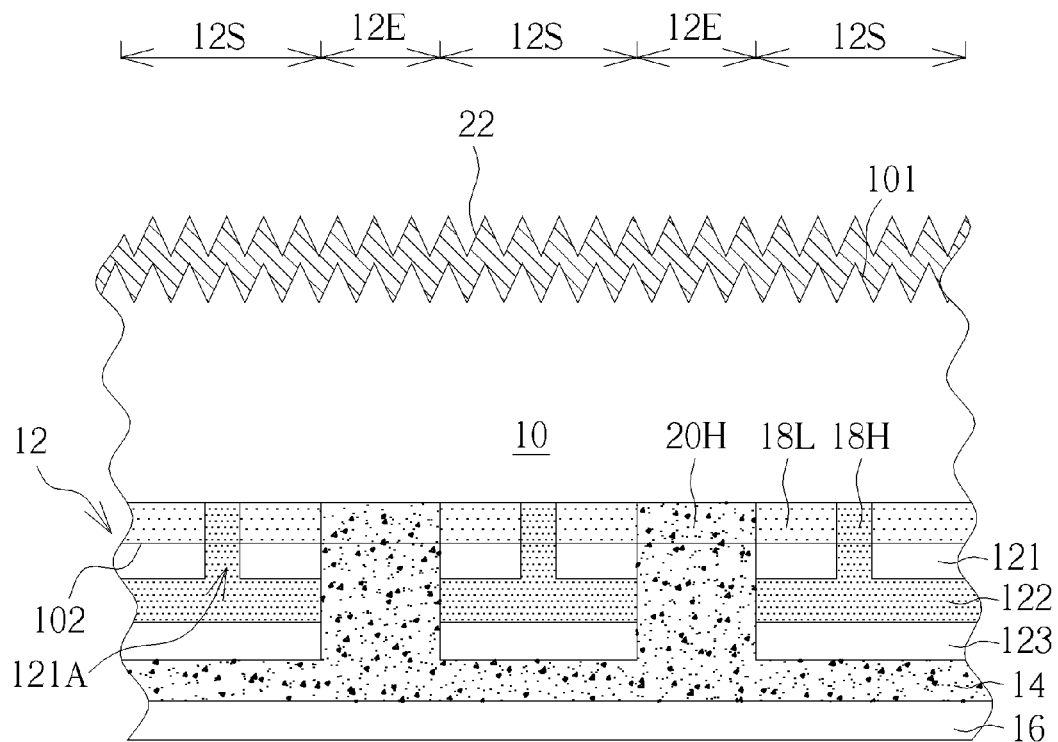

As shown in FIG. 6, a thermal process is performed: the first dopants of the first doped layer 122 are diffused into the second surface 102 of the substrate 10 so as to form a first lightly-doped region 18L of the first doped type and a first heavily-doped region 18H of the first doped type in the first shielded region 12S; moreover, the second dopants of the second doped layer 14 are diffused into the second surface 102 of the substrate 10 so as to form a second heavily-doped region 20H of the second doped type in a portion of the first exposed region 12E. In the thermal process mentioned here, the first dopants and the second dopants are diffused into the selected regions of the substrate 10 respectively when the substrate 10 is at high temperature. Therefore, this kind of thermal process is also referred to as tempering process or annealing process. The first dielectric layer 121 may slow down the diffusion rate and thus has the function of a diffusion barrier. Therefore, in the thermal process, the first heavily-doped region 18H is formed in the portion of the substrate 10 corresponding the openings 121A of the first dielectric layer 121; in other words, in the thermal process, more of the first dopants are diffused into the substrate 10 not covered by the first dielectric layer 121, and thus the first heavily-doped region 18H is with higher doping concentration. Moreover, with the diffusion barrier effect of the first dielectric layer 121, less of the first dopants are diffused into the substrate 10 covered by the first dielectric layer 121, and thus the first lightly-doped region 18L is with lower doping concentration. For example, after the thermal process, the surface doping concentration of the first heavily-doped region 18H is preferably range from about $10^{19}$ atom/cm$^3$ to about $10^{21}$ atom/cm$^3$, substantially; the surface doping concentration of the first lightly-doped region 18L is preferably range from about $10^{18}$ atom/cm$^3$ to about $10^{19}$ atom/cm$^3$, substantially, but not limited thereto. The sheet resistance, or the square resistance, of the first lightly-doped region 18L is substantially larger than 80Ω/□ (ohm/square), and sheet resistance of the first heavily-doped region 18H is substantially smaller than 50Ω/□ (ohm/square), but not limited thereto. In this embodiment, the main function of the first dielectric layer 121 in the first patterned doped stacked structure 12 is to modify the sheet resistance of the first heavily-doped region 18H and the first lightly-doped region 18L. Therefore, after the thermal process, in order to ensure the sheet resistance of the resulting the first heavily-doped region 18H and the first lightly-doped region 18L as designed, materials and manufacture process of the first dielectric layer 121 may be appropriately selected and the thickness of the first dielectric layer 121 may be well modified. On the other hand, the first patterned doped stacked structure 12 may also have the function of the diffusion barrier; therefore, a second heavily-doped region 20H may be formed within the portion of the first exposed region 12E of the substrate 10 not covered by the first patterned doped stacked structure 12. That is to say, in the thermal process, the second dopants of the second doped layer 14 may be diffused into the first exposed region 12E of the substrate 10 not covered by the first patterned doped stacked structure 12, thereby leading to high-doping-concentration in the second heavily-doped region 20H. Since the second dielectric layer 123 of the first patterned doped stacked structure 12 is used to prevent the first doped layer 122 and the second doped layer 14 from mutually doping, the material, manufacture process and thickness should be carefully designed to meet the requirement. With the second dielectric layer 123 disposed, no or little of the second dopants (with negligible concentration or amount) are diffused into the first shielded region 12S covered by the first patterned doped stacked structure 12 during the thermal process; in other words, the second dopants are hardly diffused into the first heavily-doped region 18H and the first lightly-doped region 18L, and thus the doping concentration of the first heavily-doped region 18H and the first lightly-doped region 18L are rarely changed by the second dopants. For example, after the thermal process, the surface doping concentration of the second heavily-doped region 20H is preferably range from about $10^{19}$ atom/cm$^3$ to about $10^{21}$ atom/cm$^3$, substantially, and the sheet resistance of the second heavily-doped region 20H is substantially smaller than 50Ω/□ (ohm/square), but not limited thereto. In this embodiment, the first lightly-doped region 18L and the first heavily-doped region 18H may have the first doped type, and the second heavily-doped region 20H may have the second doped type. The substrate 10 may be the first doped type or the second doped type according to the design of the solar cell. Accordingly, the method for fabricating the solar cell in this embodiment simultaneously forms the first lightly-doped region 18L of the first doped type and the first heavily-doped region 18H of the first doped type, and the second heavily-doped region 20H of the second doped type all in one single thermal process.

Moreover, an anti-reflection layer 22 is formed on the first surface 101 of the substrate 10. In this embodiment, the anti-reflection layer 22 is formed conformally on the first surface 101 of the substrate 10; therefore, the anti-reflection layer 22 has a texture surface. The anti-reflection layer 22 can increase the incident light absorption. The anti-reflection layer 22 may be a single-layered or multiple-layered structure, but not limited thereto. The material of the anti-reflection layer 22 may be silicon nitride, silicon oxide, silicon oxynitride, or other appropriate material, but not limited thereto. The anti-reflection layer 22 may be formed by a plasma-enhanced chemical vapor deposition (PECVD) process, for example, but not limited thereto.

As shown in FIG. 7, a portion of the third dielectric layer 16 and a portion of the first patterned doped stacked structure 12 are removed so as to form a first contact opening 241 exposing the first heavily-doped region 18H. In other embodiment, if the second doped layer 14 covers on majority portion of the first patterned doped stacked structure 12, preferred, the second doped layer 14 covers on all the first patterned doped stacked structure 12, and then the portion of the third dielectric layer 16, the portion of the second doped layer 14, and the portion of the first patterned doped stacked structure 12 are removed so as to form a first contact opening 241 exposing the first heavily-doped region 18H; a portion of the third dielectric layer 16 and a portion of the second doped layer 14 are removed so as to form a second contact opening 242 exposing the second heavily-doped region 20H. Then, a first electrode 261, such as an anode, is formed in the first contact opening 241 and a second electrode 262, such as a cathode, is formed in the second contact opening 242. Moreover, the first electrode 261 is electrically connected to the first heavily-doped region 18H, and the second electrode 262 is electrically connected to the second heavily-doped region 20H. The solar cell 30 of this embodiment is completed. The first electrode 261 and the first heavily-doped region 18H may form a selective emitter structure, and the second electrode 262 and the second heavily-doped region 20H may form a selective emitter structure. The material of the first electrode 261 and the second electrode 262 may be, for example, metal or alloy, or other appropriate material.

Solar cells of this disclosure and methods for fabricating the solar cells are not restricted to the preceding embodiments. Other solar cells and other feasible methods for fabricating the solar cells will be disclosed in the following paragraphs. For brevity purposes, like or similar features in multiple embodiments will be described with similar reference numerals for ease of illustration and description thereof.

Figure 8:
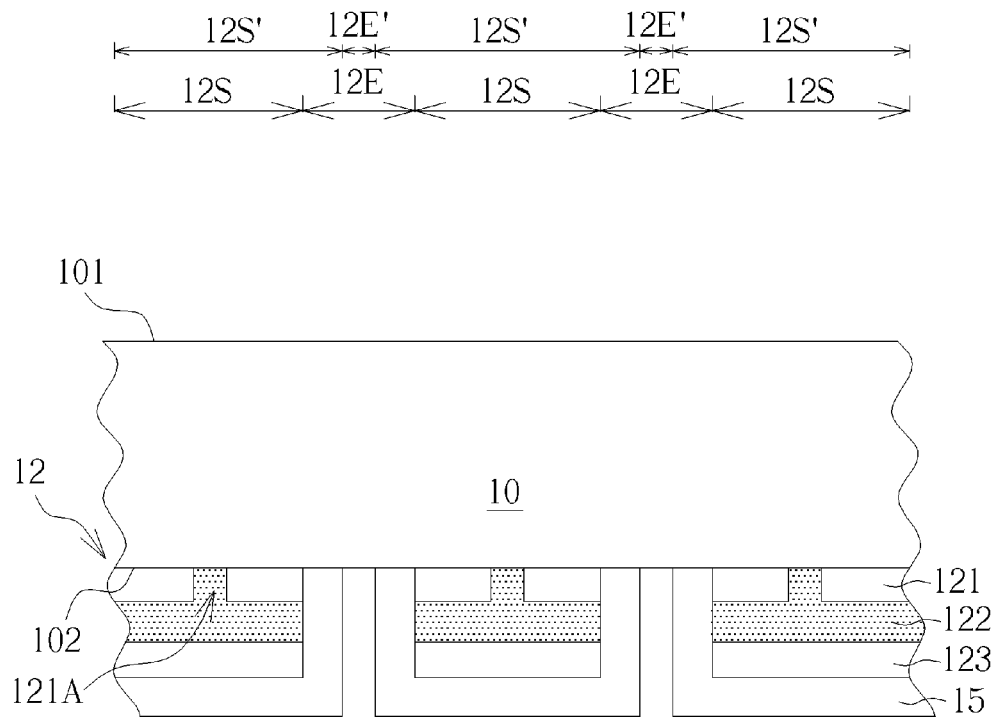
FIGS. 8-11 are schematic diagrams illustrating the method for fabricating a solar cell according to a second embodiment of this disclosure.

Referring to FIGS. 8-11, and also refer to FIGS. 1-4. FIGS. 8-11 are schematic diagrams illustrating the method for fabricating a solar cell according to a second embodiment of this disclosure. The method for fabricating the solar cell of this embodiment continues from the step of FIG. 4 of the first embodiment. As shown in FIG. 8, after the first patterned doped stacked structure 12 is formed, a fourth dielectric layer 15 is formed on the first patterned doped stacked structure 12 and the second surface 102 of the substrate 10. Then, the fourth dielectric layer 15 is patterned so as to cover the first patterned doped stacked structure 12 and shield a portion of the first exposed region 12E, thereby forming at least one second shielded region 12S' and at least one second exposed region 12E'. The second exposed region 12E' has a second dimension, and the second dimension of the second exposed region 12E' is smaller than the first dimension of the first exposed region 12E—that is to say, the second exposed region 12E' is located in the first exposed region 12E. The fourth dielectric layer 15 may be a single-layered or multiple-layered structure, but not limited thereto. The material of the fourth dielectric layer 15, preferred, inorganic dielectric materials may be silicon oxide, silicon oxynitride, or silicon nitride, but it may be other appropriate organic or inorganic dielectric materials, for example, alumina. The thickness of the second dielectric layer 123, for example, is substantially greater than 100 nm, and the thickness of the fourth dielectric layer 15, for example, is substantially 1-20 nm, but not limited thereto. The fourth dielectric layer 15 may be formed by a chemical vapor deposition (CVD) process, for example, an atmospheric-pressure chemical vapor deposition (APCVD) process, but not limited to this and the fourth dielectric layer 15 may also be formed by, for example, a physical vapor deposition process, chemical oxidation process, a spin coating process, an ink jet printing process, or a screen printing process.

Figure 9:
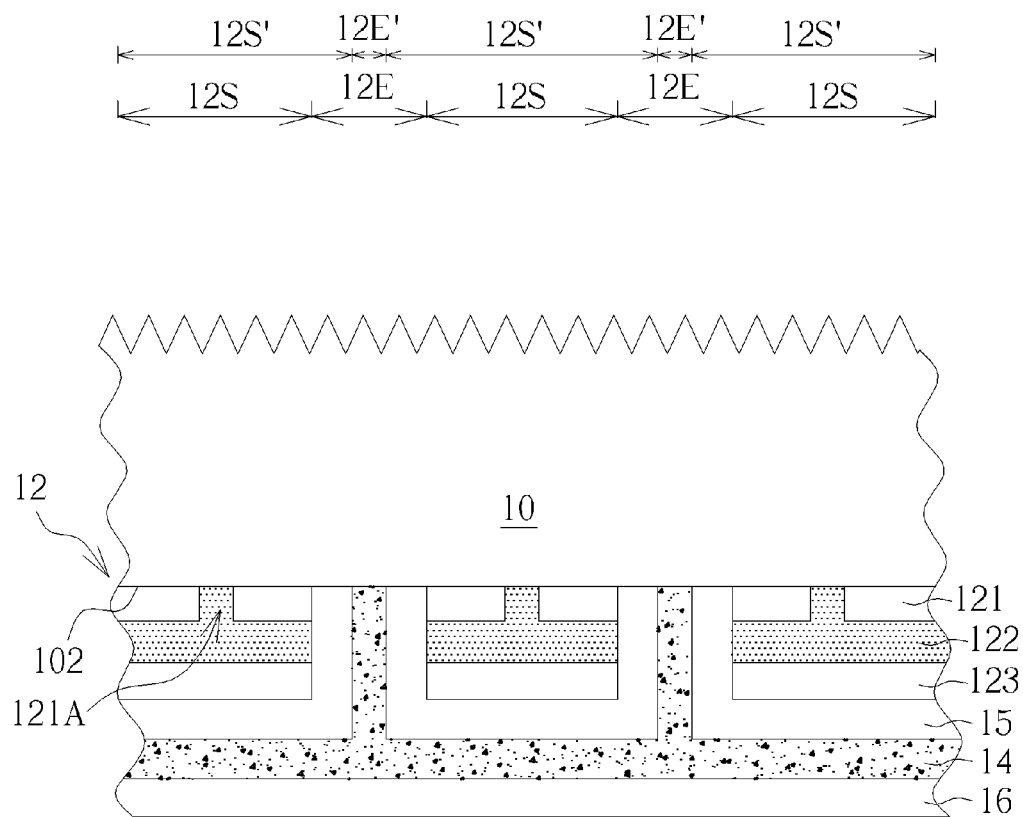

As shown in FIG. 9, the second doped layer 14 is formed to cover the fourth dielectric layer 15 and the second surface 102 of the substrate 10, and the second doped layer 14 contacts the second surface 102 of the substrate 10 which is exposed within the second exposed region 12E'. Then, the third dielectric layer 16 is formed on the second doped layer 14. A texturing process is carried out to make the first surface 101 of the substrate 10 a textured surface, therefore increasing the incident light absorption.

Figure 10:
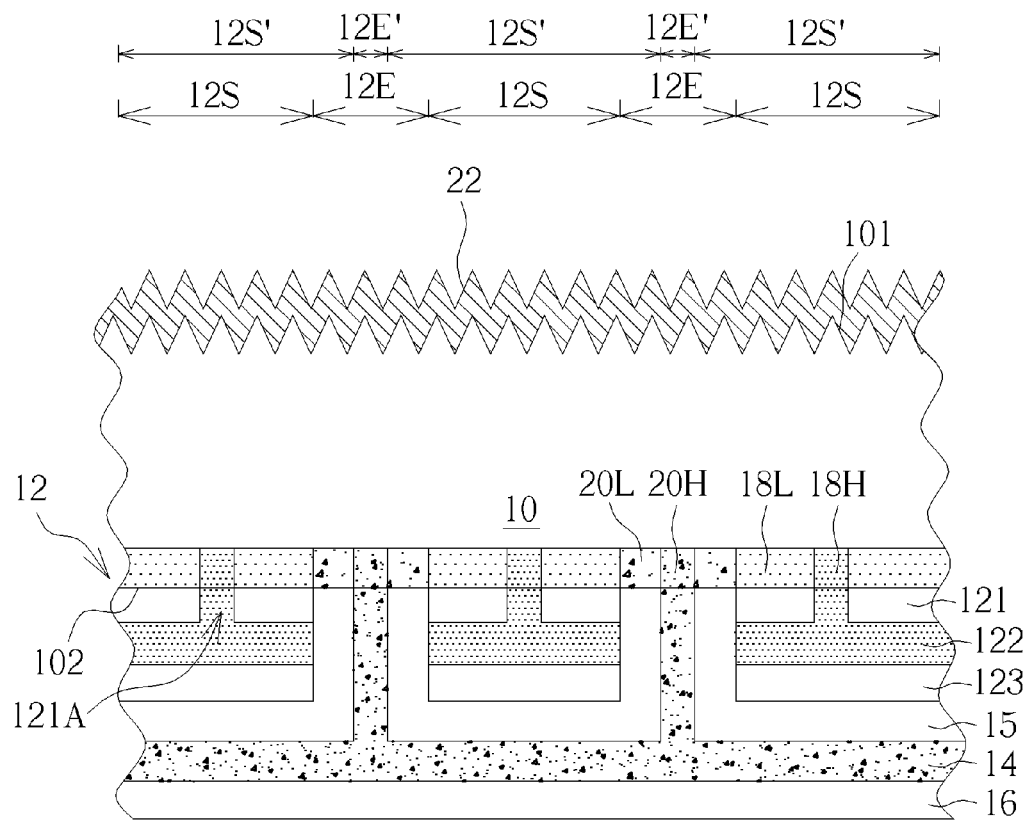

As shown in FIG. 10, a thermal process is performed: the first dopants of the first doped layer 122 are diffused into the second surface 102 of the substrate 10 so as to form at least two first lightly-doped regions 18L and at least one first heavily-doped region 18H in the first shielded region 12S; moreover, the second dopants of the second doped layer 14 are diffused into the second surface 102 of the substrate 10 so as to form at least one second heavily-doped region 20H in the second exposed region 12E', and the second dopants of the second doped layer 14 are diffused into the second surface 102 of the substrate 10 so as to form at least two the second lightly-doped regions 20L in the portion of the first exposed region 12E outside of the second exposed region 12E'. Preferably, the at least one heavily-doped regions mentioned above are located between the at least two of the lightly-doped regions mentioned above, but not limited thereto. Referring to the illustration about the term of the thermal process in the previous embodiment for the thermal process of this embodiment. The main difference between the method for fabricating the solar cell of this embodiment and that of the first embodiment is the fourth dielectric layer 15. The fourth dielectric layer 15 in this embodiment covers a portion of the first exposed region 12E, and the fourth dielectric layer 15 also has the diffusion barrier effect. Therefore, in the thermal process, the second heavily-doped region 20H of higher doping concentration may be formed in the substrate 10 corresponding to the second exposed region 12E', and the second lightly-doped region 20L of lower doping concentration may be formed in the first exposed region 12E of the substrate 10 outside of the second exposed region 12E' covered by the fourth dielectric layer 15. For example, after the thermal process, the surface doping concentration of the first heavily-doped region 18H is preferably range from about $10^{19}$ atom/cm$^3$ to about $10^{21}$ atom/cm$^3$, substantially; the surface doping concentration of the first lightly-doped region 18L is preferably range from about $10^{18}$ atom/cm$^3$ to about $10^{19}$ atom/cm$^3$, substantially; the surface doping concentration of the second heavily-doped region 20H is preferably range from about $10^{19}$ atom/cm$^3$ to about $10^{21}$ atom/cm$^3$, substantially; the surface doping concentration of the second lightly-doped region 20L is preferably range from about $10^{18}$ atom/cm$^3$ to about $10^{19}$ atom/cm$^3$, but not limited thereto. The sheet resistance of the first heavily-doped region 18H is substantially smaller than 50Ω/☐ (ohm/square); the sheet resistance of the first lightly-doped region 18L is substantially larger than 80Ω/☐ (ohm/square); the sheet resistance of the second heavily-doped region 20H is substantially smaller than 50Ω/☐ (ohm/square); the sheet resistance of the second lightly-doped region 20L is substantially larger than 80Ω/☐ (ohm/square), but not limited thereto. In this embodiment, the main function of the fourth dielectric layer 15 is to modify the sheet resistance of the second heavily-doped region 20H and the sheet resistance of the second lightly-doped region 20L. Therefore, in order to ensure the sheet resistance of the resulting the second heavily-doped region 20H and the resulting second lightly-doped region 20L as designed after the thermal process, materials and manufacture process of the fourth dielectric layer 15 should be appropriately selected and the thickness of the fourth dielectric layer 15 may be well modified. Moreover, an anti-reflection layer 22 is formed on the first surface 101 of the substrate 10. Accordingly, the method for fabricating the solar cell in this embodiment simultaneously forms the first lightly-doped region 18L of the first doped type, the first heavily-doped region 18H of the first doped type, the second heavily-doped region 20H of the second doped type and the second lightly-doped region 20L of the second doped type all in one single thermal process.

Figure 11:
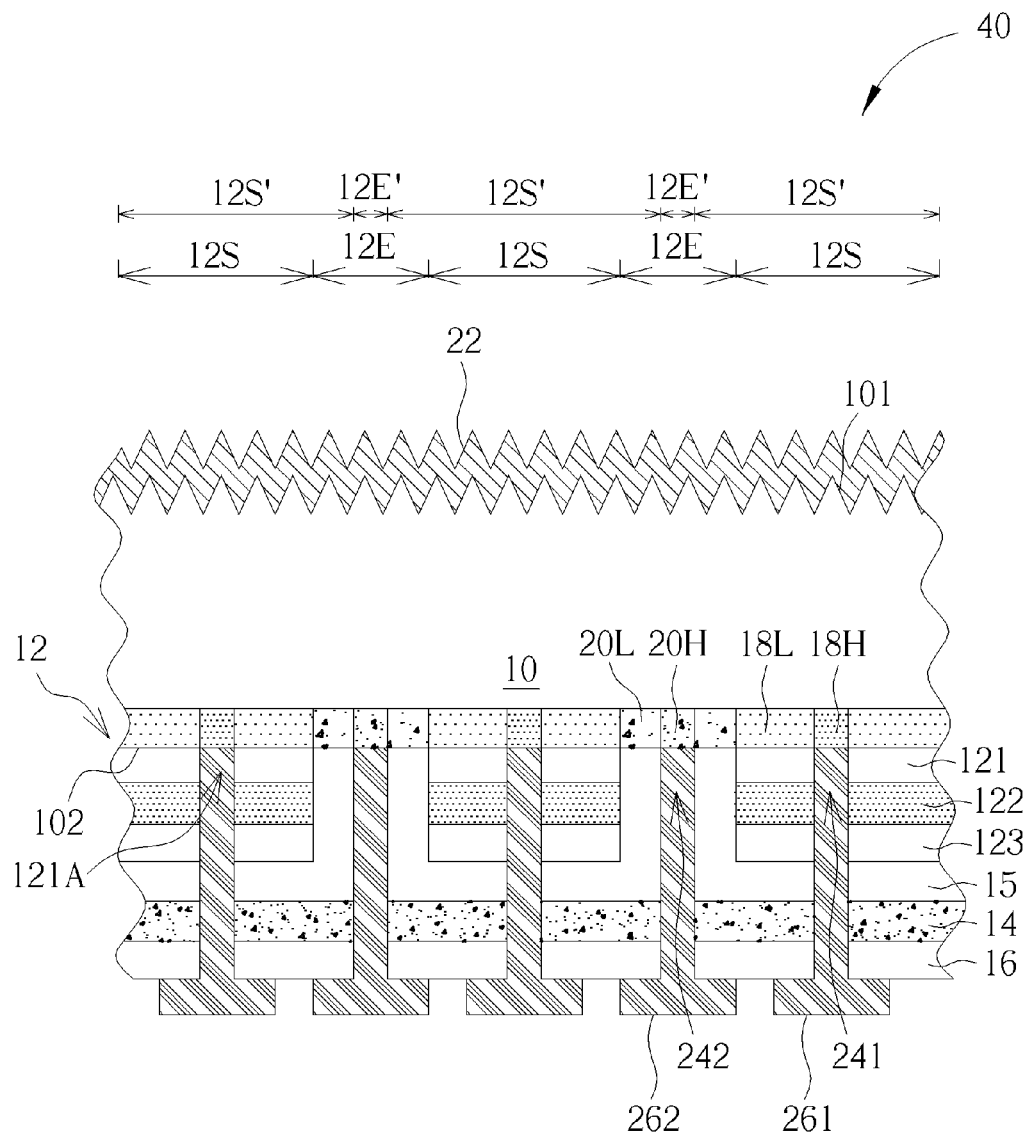

As shown in FIG. 11, a portion of the third dielectric layer 16, a portion of the fourth dielectric layer 15 and a portion of the first patterned doped stacked structure 12 are removed so as to form a first contact opening 241 exposing the first heavily-doped region 18H. In other embodiment, if the second doped layer 14 covers on majority portion of the fourth dielectric layer 15, preferred, the second doped layer 14 covers on all the fourth dielectric layer 15, and then the portion of the third dielectric layer 16, the portion of the second doped layer 14, the portion of the fourth dielectric layer 15, and the portion of the first patterned doped stacked structure 12 are removed so as to form a first contact opening 241 exposing the first heavily-doped region 18H; a portion of the third dielectric layer 16, a portion of the fourth dielectric layer 15 and a portion of the second doped layer 14 are removed so as to form a second contact opening 242 exposing the second heavily-doped region 20H. Then, a first electrode 261 is formed in the first contact opening 241 and a second electrode 262 is formed in the second contact opening 242. Moreover, the first electrode 261 is electrically connected to the first heavily-doped region 18H, and the second electrode 262 is electrically connected to the second heavily-doped region 20H. The solar cell 40 of this embodiment is completed.

Figure 12:
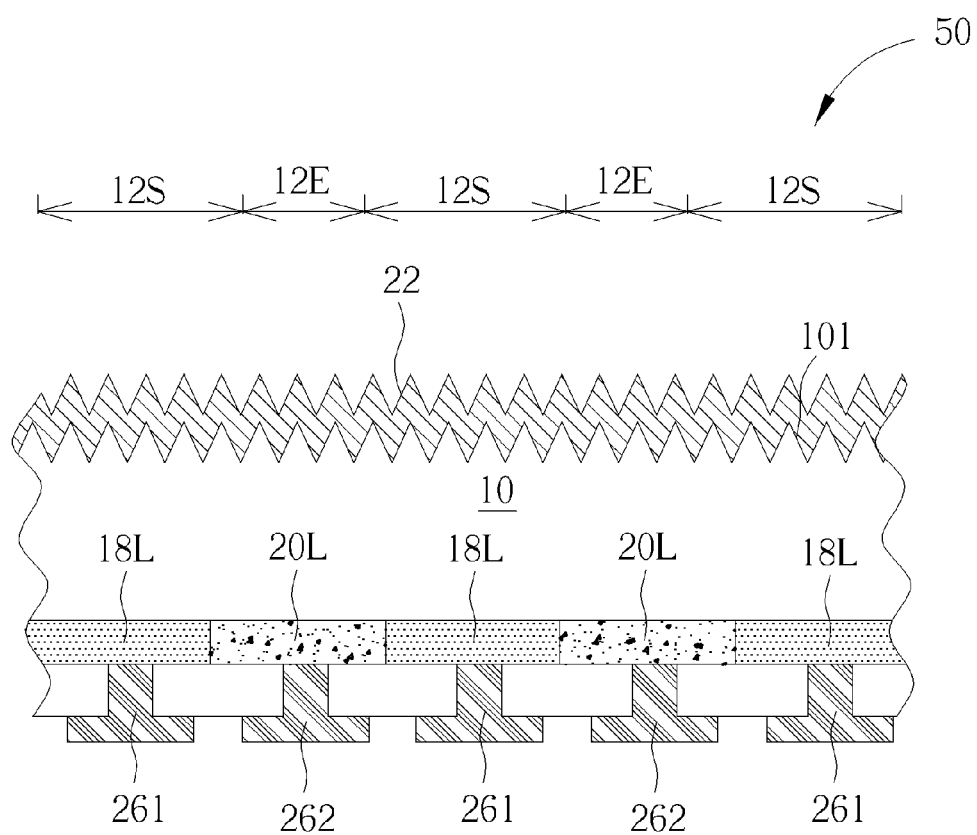
FIG. 12 is a diagram illustrating a solar cell according to a comparative embodiment of this disclosure.

Referring to FIG. 12 is a diagram illustrating a solar cell according to a comparative embodiment of this disclosure. As shown in FIG. 12, the solar cell 50 of the comparative embodiment does not include a selective emitter structure. The first lightly-doped region 18L and the second lightly-doped region 20L are formed in one single semiconductor layer. The first electrode 261 contacts the first lightly-doped region 18L, and the second electrode 262 contacts the second lightly-doped region 20L. Because, the contact resistance is higher, therefore the solar cell has higher surface recombination and lower infrared light absorption.

The solar cell in the disclosure is an interdigitated back electrode solar cell with a selective emitter structure. Because the first electrodes 261 and the second electrodes 262 are disposed on the second surface 102 of the substrate 10, the incident light absorption to the first surface 101 of the substrate 10 increases. Moreover, the first electrode 261 contacts the first heavily-doped region 18H and the second electrode 262 contacts the second heavily-doped region 20H; therefore, the contact resistance is lower. Since both of the first lightly-doped region 18L and the second lightly-doped region 20L, which are lightly doped, have lower the saturation current, the recombination of electron-hole pair reduces, and, at the same time, infrared absorption and photo-electric conversion efficiency increase. Comparing to the photo-electric conversion efficiency of the solar cell of the comparative of the embodiment, the photo-electric conversion efficiency of the solar cell in the embodiments of the disclosure may further increase about 0.5% to about 0.6% substantially. Moreover, the first patterned doped stacked structure is used as the diffusion barrier in the method for fabricating the solar cell of this disclosure; therefore, with only one single thermal process, the first lightly-doped region of the first doped type, the first heavily-doped region of the first doped type, the second heavily-doped region of the second doped type and the second lightly-doped region of the second doped type are all formed, thereby simplifying manufacturing process and lowering down the cost.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A solar cell, comprising:
   a substrate, wherein the substrate has a first surface and a second surface disposed opposite to the first surface, and the first surface is a light incident surface;
   a first lightly-doped region disposed adjacent to the second surface in the substrate;
   a first heavily-doped region disposed adjacent to the second surface in the substrate, wherein the first lightly-doped region and the first heavily-doped region have a first doped type;
   a second heavily-doped region, disposed adjacent to the second surface in the substrate, wherein the second heavily-doped region has a second doped type opposite to the first doped type;
   a first patterned doped stacked structure disposed on the second surface of the substrate and corresponding to the first lightly-doped region, wherein the first patterned doped stacked structure exposes the first heavily-doped region and the second heavily-doped region, the first patterned doped stacked structure comprises a first dielectric layer, a first doped layer and a second dielectric layer, wherein the first dielectric layer, the first doped layer and the second dielectric layer are mutually stacked;
   a second doped layer disposed on the first patterned doped stacked structure and the second surface in the substrate, wherein the second doped layer exposes a portion of the first heavily-doped region and a portion of the second heavily-doped region;
   a first electrode electrically connected to the first heavily-doped region exposed by the first patterned doped stacked structure and the second doped layer; and
   a second electrode electrically connected to the second heavily-doped region exposed by the first patterned doped stacked structure and the second doped layer.

2. The solar cell according to claim 1, wherein a sheet resistance of the first lightly-doped region is substantially larger than 80$\Omega/\square$, a sheet resistance of the first heavily-doped region is substantially smaller than 50$\Omega/\square$, and a sheet resistance of the second heavily-doped region is substantially smaller than 50 $\Omega/\square$.

3. The solar cell according to claim 1, wherein the substrate has the first doped type or the second doped type.

4. The solar cell according to claim 1, wherein the first surface of the substrate has a texture surface.

5. The solar cell according to claim 1, further comprising an anti-reflection layer disposed on the first surface of the substrate.

6. The solar cell according to claim 1, wherein a thickness of the first dielectric layer is substantially range from 1 nm to 20 nm, and a thickness of the second dielectric layer is substantially greater than 100 nm.

7. The solar cell according to claim 1, further comprising a third dielectric layer disposed on the second doped layer.

8. The solar cell according to claim 7, wherein a thickness of the third dielectric layer is substantially greater than 100 nm.

9. The solar cell according to claim 1, further comprising:
   a second lightly-doped region, disposed adjacent to the second surface in the substrate, wherein the second lightly-doped region has the second doped type; and
   a fourth dielectric layer covering the first patterned doped stacked structure and shielding a portion of the second lightly-doped region.

10. The solar cell according to claim 9, wherein a thickness of the fourth dielectric layer is substantially range from 1 nm to 20 nm.

11. The solar cell according to claim 9, wherein a sheet resistance of the second lightly-doped region is substantially larger than 80$\Omega/\square$.

* * * * *